United States Patent
Nakata et al.

(10) Patent No.: US 10,038,086 B2
(45) Date of Patent: Jul. 31, 2018

(54) PROCESS FOR FORMING A HIGH ELECTRON MOBILITY TRANSISTOR

(71) Applicant: SUMITOMO ELECTRIC INDUSTRIES, LTD., Osaka (JP)

(72) Inventors: Ken Nakata, Yokohama (JP); Tsuyoshi Kouchi, Yokohama (JP); Isao Makabe, Yokohama (JP); Keiichi Yui, Yokohama (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 0 days.

(21) Appl. No.: 15/459,999

(22) Filed: Mar. 15, 2017

(65) Prior Publication Data
US 2017/0271496 A1    Sep. 21, 2017

(30) Foreign Application Priority Data
Mar. 16, 2016    (JP) .................. 2016-052438

(51) Int. Cl.
| H01L 29/778 | (2006.01) |
| H01L 29/66 | (2006.01) |
| H01L 21/02 | (2006.01) |
| H01L 29/10 | (2006.01) |
| H01L 29/20 | (2006.01) |

(52) U.S. Cl.
CPC ...... *H01L 29/7787* (2013.01); *H01L 21/0254* (2013.01); *H01L 21/0262* (2013.01); *H01L 21/02378* (2013.01); *H01L 21/02458* (2013.01); *H01L 21/02505* (2013.01); *H01L 29/1075* (2013.01); *H01L 29/66462* (2013.01); *H01L 29/2003* (2013.01)

(58) Field of Classification Search
CPC ........... H01L 29/7787; H01L 29/66462; H01L 29/1033
See application file for complete search history.

(56) References Cited

U.S. PATENT DOCUMENTS

| 9,231,064 B1* | 1/2016 | Reza ................. H01L 29/66462 |
| 2005/0133816 A1* | 6/2005 | Fan .................... H01L 29/66462 257/190 |
| 2011/0006346 A1* | 1/2011 | Ando .................. H01L 29/4236 257/192 |
| 2017/0125566 A1* | 5/2017 | Nakamura .......... H01L 29/7787 |
| 2017/0229550 A1* | 8/2017 | Morvan ................ H01L 29/207 |

FOREIGN PATENT DOCUMENTS

| JP | 2000-031588 | 1/2000 |
| JP | 2013-074209 | 4/2013 |

* cited by examiner

*Primary Examiner* — Dung Le
(74) *Attorney, Agent, or Firm* — Smith, Gambrell & Russell, LLP.

(57) ABSTRACT

A process of forming a High Electron Mobility Transistor (HEMT) made of nitride semiconductor materials is disclosed. The process sequentially grows a buffer layer, a n-type layer doped with n-type dopants, and a channel layer by a metal organic chemical vapor deposition (MOCVD) technique. A feature of the process is to supply only an n-type dopant gas before the growth of the n-type layer but after the growth of the buffer layer.

7 Claims, 9 Drawing Sheets

PROCESS FOR FORMING A HIGH ELECTRON MOBILITY TRANSISTOR

BACKGROUND OF THE INVENTION

1. Field of the Invention

The present invention relates to a high electron mobility transistor (HEMT), in particular, a HEMT made of nitride semiconductor materials, and a method of forming the same.

2. Related Prior Arts

A HEMT made of nitride semiconductor materials, typically gallium nitride (GaN), has been well known because those nitride semiconductor materials inherently have wider bandgap energy and show excellently high breakdown voltages. Such a HEMT may be made by epitaxially growing on a substrate, a buffer layer, a channel layer, and a barrier layer. A Japanese patent laid open No. JP 2013-074209A has disclosed a HEMT having, on a silicon (Si) substrate, a buffer layer made of aluminum nitride (AlN), another buffer layer made of aluminum gallium nitride (AlGaN), and a channel layer made of gallium nitride (GaN). The prior art above has also described that the substrate of Si may be replaced by that made of silicon carbide (SiC). Another Japanese patent laid open No. JP 2015-082517 has also disclosed a HEMT having the buffer layer comprising two AlN layers and two AlGaN layers stacked, where the two AlGaN layers have an aluminum composition different from each other.

In a HEMT made of nitride semiconductor materials, an instable phenomenon has been also known where a drain current thereof decreases after turning-off the HEMT, which is called as the current collapsing. That is, after a high drain bias concurrently with a deep gate bias, that is, the transistor is fully turned off under the high drain bias is applied, the drain current does not recover an original value shown before the turning off. This phenomenon may be described as follows: electrons are captured in traps induced within the barrier layer during the turning off, which equivalently charges the surface of the barrier layer in negative and accordingly, narrows the channel. Because the deep traps generally show longer life time, a period from the capture of the electrons to the release thereof, it takes relatively longer time to recover the width of the channel. Thus, the current collapsing degrades high-frequency performance of the HEMT.

SUMMARY OF THE INVENTION

One aspect of the present invention relates to a semiconductor apparatus of a type of high electron mobility transistor (HEMT) made of nitride semiconductor materials. The HEMT of the invention includes, on a substrate made of silicon carbide (SiC), an aluminum nitride (AlN) layer, an n-type aluminum gallium nitride (n-AlGaN) layer, a channel layer made of gallium nitride (GaN), and a barrier layer made of un-doped AlGaN layer, where those semiconductor layers are sequentially provided on the SiC substrate in this order. A feature of the HEMT of the present invention is that the n-AlGaN layer, which is doped with n-type dopants, is provided on the AlN layer and the GaN channel layer is provided on the n-AlGaN layer.

Another aspect of the present invention relates to a process of forming a HEMT that includes steps of: sequentially growing an AlN layer, an n-type AlGaN layer, an undoped GaN layer, and an AlGaN barrier layer on a SiC substrate by a metal organized chemical vapor deposition (MOCVD) technique. A feature of the process of the invention is that a step of, after growing the AlN layer but before growing the n-AlGaN layer, supplying only dopant gas within an apparatus of the MOCVD technique.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF EMBODIMENT

Next, details of the present invention will be described as referring to accompany drawings. In the description of the drawings, numerals or symbols same with or similar to each other will refer to elements same with or similar to each other without overlapping descriptions.

Figure 1:
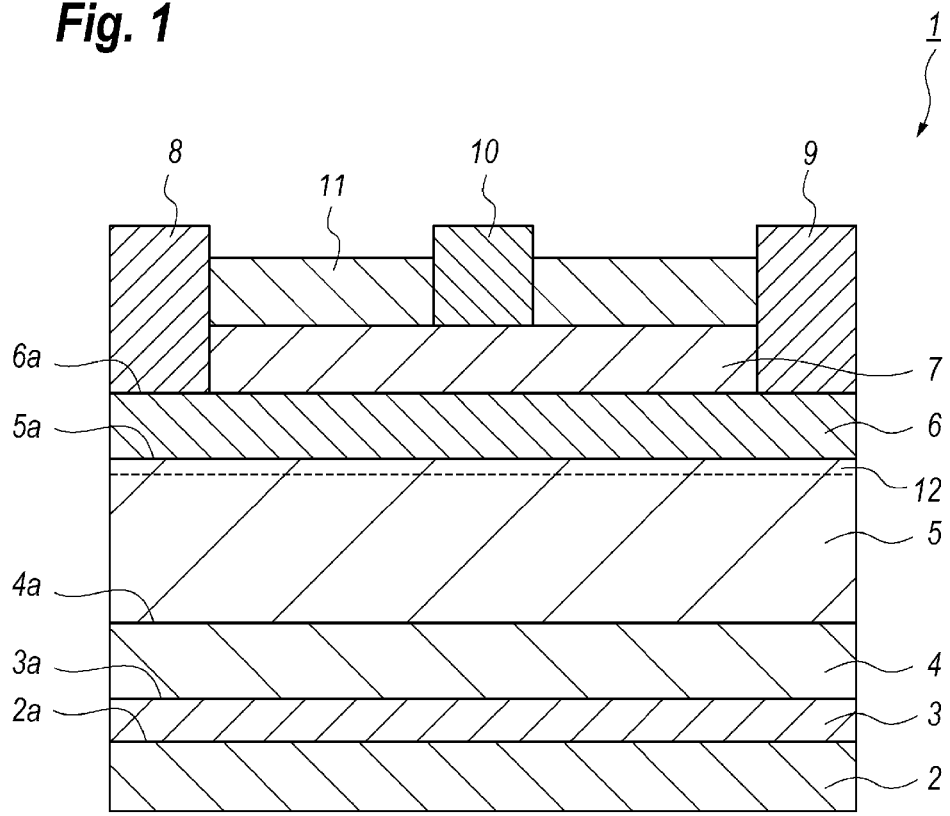
FIG. 1 schematically shows a cross section of a high electron mobility transistor (HEMT) according to embodiment of the present invention.
Figure 2:
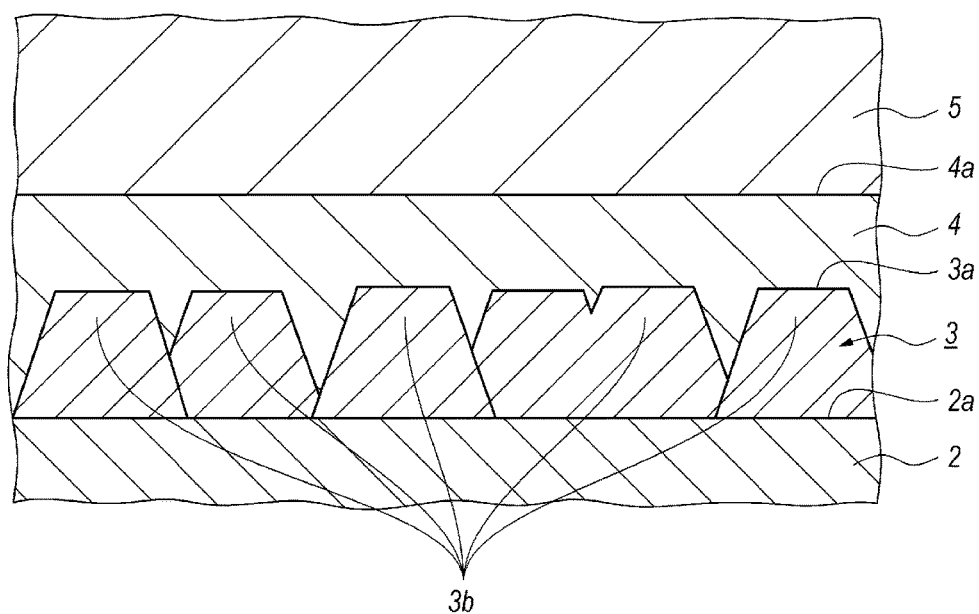
FIG. 2 magnifies a portion of the HEMT shown FIG. 1.

FIG. 1 schematically shows a cross section of a high electron mobility transistor (HEMT) according to an embodiment of the present invention; FIG. 2 magnifies a portion of the HEMT 1 shown in FIG. 1. The HEMT 1 of the embodiment provides a substrate 2 made of silicon carbide (SiC), an aluminum nitride (AlN) layer 3, an n-type aluminum gallium nitride (n-AlGaN) layer 4, a channel layer made of gallium nitride (GaN) 5, a barrier layer made of aluminum gallium nitride (AlGaN) 6, a cap layer 7, a source electrode 8, a drain electrode 9, a gate electrode 10, and a passivation film 11. The AlN layer 3, the n-AlGaN layer 4, the GaN channel layer 5, the AlGaN barrier layer 6, and the cap layer 7 are grown on the substrate 2.

The SiC substrate 2, as described above, is prepared for growing the semiconductor layers, 3 to 7, on a primary surface 2a thereof. The AlN layer 3 has a function of the nucleation layer for the GaN channel layer 5. The AlN layer 3 may have a thickness of 13 to 20 nm, which means that the AlN layer 3 is not continuous on the substrate 2 but causes island structures 3b as FIG. 2 illustrates. Accordingly, the primary surface 2a of the substrate 2 is unnecessary to match the lattice constant thereof with that of the AlN layer 3.

The n-AlGaN layer 4, which is grown on a top 3a of the AlN layer 3, also operates as a buffer layer for the GaN channel layer 5. The n-AlGaN layer 4 preferably has a thickness of 45 to 55 nm and an aluminum composition of 0 to 5%. The maximum aluminum composition in the n-AlGaN layer may further preferable to be 2.5%. The n-AlGaN layer 4 may fill gaps between the island structures 3b in the AlN layer 3, which may not only flatten a top surface 4a thereof but suppress inducement of dislocations therein.

The n-AlGaN layer 4 may dope n-type impurities, generally silicon (Si), selenium (Se), sulfur (S), and so on, by a concentration of 0.5 to $1.2\times10^{18}$ cm$^{-3}$ in order to cause a leak current flowing therein greater than 0.1 µA/mm but smaller than 100 µA/mm under practical operation of the HEMT 1. A leak current greater than 100 µA/mm sets the HEMT 1 in a normally-on mode. In order not to cause the normally-on mode securely, the maximum impurity concentration is limited to be $1.0\times10^{18}$, preferably less than $0.6\times10^{18}$ cm$^{-3}$.

The GaN channel layer 5 may transport carriers. A GaN layer is hard, almost impossible to be directly grown on the SiC substrate 2 because of the wettability thereof against a SiC layer. Accordingly, the GaN channel layer 5 is grown on the top surface 4a of the n-AlGaN layer. The GaN channel layer may have a thickness of 900 to 1100 nm with a surface 5a thereof smooth or flat enough when the AlN layer 3 has the thickness of 13 to 20 nm and the n-AlGaN layer has the thickness of 45 to 55 nm. The GaN channel layer 5 may have a thickness of 200 to 500 nm with the surface 5a thereof smooth and flat enough when the AlN layer 3 has the thickness above, while, the n-AlGaN layer has a thickness of 45 to 55 nm and an aluminum composition of 0 to 5%.

The AlGaN barrier layer 6, which causes carries in the GaN channel layer 5 by the piezo effect, exactly, a channel in the GaN channel layer at the interface against the AlGaN barrier layer 6, where the channel may behave as a two-dimensional electron gas (2DEG). The AlGaN barrier layer 6 may have a thickness of 10 to 30 nm. Also, the AlGaN barrier layer 6 may show an n-type conduction, and/or, contain indium (In). The cap layer 7, which is grown on a top 6a of the AlGaN barrier layer 6, may be made of gallium nitride (GaN), or n-type GaN, by a thickness of 3 to 10 nm.

The source electrode 8 and the drain electrode 9, which are formed on and in direct contact to the top 6a of the barrier layer 6 as partially removing the cap layer 7. The source and drain electrodes, 8 and 9, are, what is called, ohmic electrodes showing the non-rectifier current to voltage characteristic, and may be made of metal stack containing titanium (Ti) and aluminum (Al), where the former (Ti) is in direct contact to the AlGaN barrier layer 6.

The gate electrode 10, which is provided on the cap layer 7 between the source and drain electrodes, 8 and 9, may be made of metal stack containing nickel (Ni) and gold (Au). The gate electrode 10 may further provide palladium (Pd) between Ni and Au. The gate electrode 10 may be formed on, or in direct contact to, the top 6A of the AlGaN barrier layer 6. The passivation film 11, which covers the electrodes, 8 to 10, and the cap layer 7 exposed between the electrodes, 8 to 10, may be made of silicon nitride (SiN).

The HEMT 1, as described above, provides the 2DEG at the interface between the GaN channel layer 5 and the AlGaN barrier layer 6, exactly immediate to the top 5a of the GaN channel layer 6, and this 2DEG may operate as the channel of carrier transportation. Also, the HEMT 1 further provides the n-AlGaN layer 4 between the AlN buffer layer 3 and the GaN channel layer. The n-AlGaN layer, which has a bandgap energy greater than that of the GaN channel layer 5, may raise the bottom of the conduction band of the AlN buffer layer 3. That is, the HEMT 1 has a band diagram, in particular, conduction bands in a region deeper than the channel is raised by the existence of the n-AlGaN layer 4 and the AlN buffer layer 3; accordingly, the HEMT 1A may improve, what is called, the short channel effect, which means that the HEMT 1A may show excellent saturation in drain current even when the gate length thereof is shortened.

Next, a process of forming the HEMT 1 of the present invention will be described as referring to FIGS. 3A to 4B, that show cross section of the HEMT 1 at respective processes.

Figure 3A:
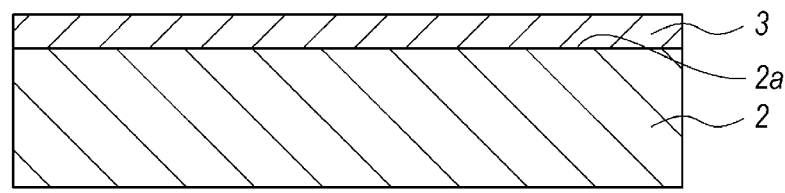
FIG. 3A illustrates a process of growing the buffer layer on the surface of the substrate.

First, as FIG. 3A illustrates, the AlN buffer layer 3 is grown on the surface 2a of the SiC substrate as the island structures 3b each having a thickness of about 20 nm by the metal organized chemical vapor deposition (MOCVD) technique as the first step. The MOCVD technique uses, for instance, tri-methyl-aluminum (TMA) as a source material for the group III element and ammonia. (NH$_3$) as a source material for the group V element; sets a temperature of the SiC substrate to be 1080° C. and a pressure within an apparatus thereof to be 13.3 kPa.

Figure 3B:
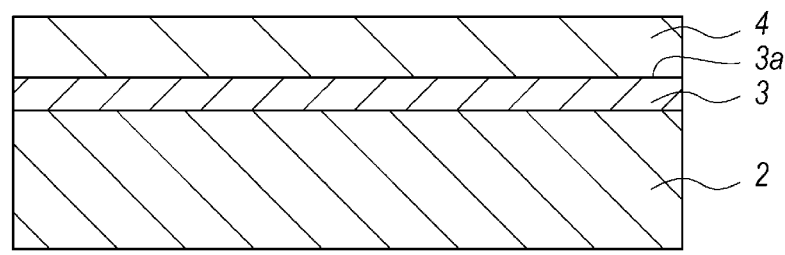
FIG. 3B illustrates a process of growing the doped layer on the buffer layer.

Second, as FIG. 3B illustrates, the MOCVD technique further grows the n-AlGaN layer 4 on the surface 3A of the AlN layer 3 by a thickness of 50 nm using the TMA and a tri-methyl-gallium (TMG) as the source materials for Al and Ga, respectively, and the NH$_3$ for nitrogen N. Also the MOCVD uses silane (SiH4) as a dopant material for silicon (Si). Flow rates of the gasses are 100 µmol/min, 120 µmol/min, 0.5 mol/min, and 0.01 µmol/min for TMG, TMA, NH$_3$, and SiH$_4$, respectively. The growth pressure and the growth temperature are set to be the same with those for the AlN layer, that is, the pressure and the temperature are 13.3 kPa and 1080° C., respectively. Under such a growth condition, the n-AlGaN layer 4 may be grown on the AlN layer 3 with a growth rate of 0.4 nm/sec.

The growth of the n-AlGaN layer 4 is further described. The process first supplies only SiH$_4$ just after the completion of the growth of the AlN layer 3 but the start of growth of the n-AlGaN layer 4. Then, the other three source materials of the TMG, the TMA, and the NH$_3$ are supplied. During the supplement of only the SiH$_4$ the temperature of the substrate 2 is maintained to be equal to that during the growth of the AlN layer 3, namely, 1080° C.

Figure 3C:
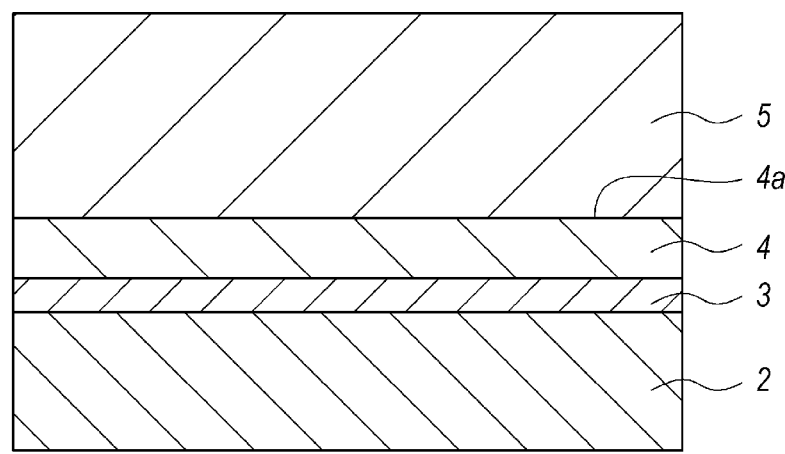
FIG. 3C illustrates a process of growing the channel layer on the doped layer.

Then, as the third step illustrated, in FIG. 3C, the MOCVD technique grows on the surface 4a of the n-AlGaN layer 4 the GaN channel layer 5 by supplying the source materials of the TMG and the NH$_3$ for gallium (Ga) and nitrogen (N), respectively. The flow rates of the two sources are 120 µmol/min and 0.5 mol/min, respectively; while, the pressure within the apparatus and the temperature of the substrate 2 are set to be equal to those for the growth of the AlN layer 3. Under such grown conditions, the GaN channel layer may be grown by the rate of 0.4 nm/sec.

Figure 4A:
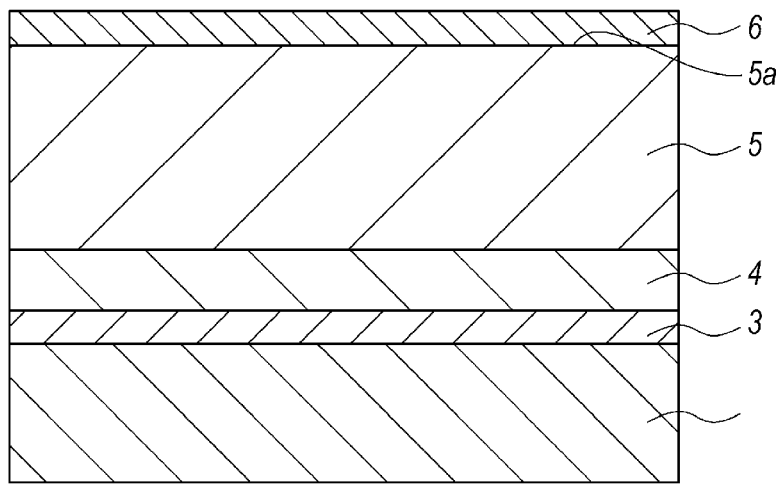
FIG. 4A illustrates a process of growing the barrier layer on the channel layer.

The process then grows the AlGaN barrier 6 on the surface 5a of the channel layer 5 as the fourth step with a thickness of 20 nm as shown in FIG. 4A. The source materials for the AlGaN barrier layer are the same as those for the growth of the n-AlGaN layer 4; and the pressure within the apparatus and the temperature of the substrate 2 are also the same as those for the growth of the AlN layer 3, namely, 13.3 kPa and 1080° C., respectively. Different from the n-AlGaN layer 3, the MOCVD technique does not supply SiH$_4$ because the barrier layer 6 is grown substantially un-doped.

Figure 4B:
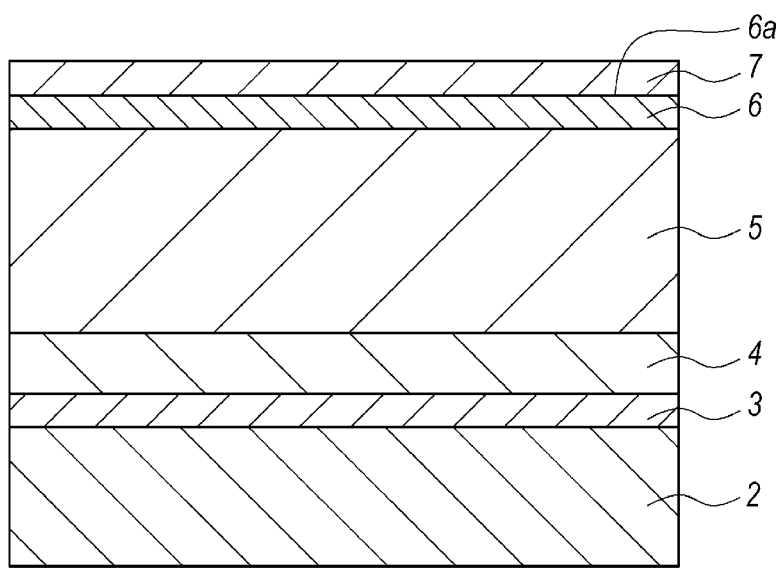
FIG. 4B illustrates a process of growing the cap layer on the barrier layer.

Then, as FIG. 4B illustrates as the fifth step, the MOCVD technique may grow the GaN cap layer 7 on the surface 6a of the AlGaN barrier layer 6 by a thickness of 5 nm by using TMG and NH$_3$ as the source materials. Growth conditions for the GaN cap layer 7, in particular, the temperature of the substrate 2 and the pressure within the apparatus, are same with those for growing the AlGaN barrier layer 6. Accordingly, the present embodiment keeps the growth conditions of the temperature of the substrate 2 and the pressure within the apparatus from the growth of AlN layer 3 to the growth of the GaN cap layer 7.

Then, the process may form the source, drain, and gate electrodes, 8 to 10; and deposit the passivation film 11 on the substrate 2. Those processes for the electrodes, 8 to 11, may use the photolithography. Thus, the process of forming the HEMT 1 of the present embodiment is completed.

Figure 5:
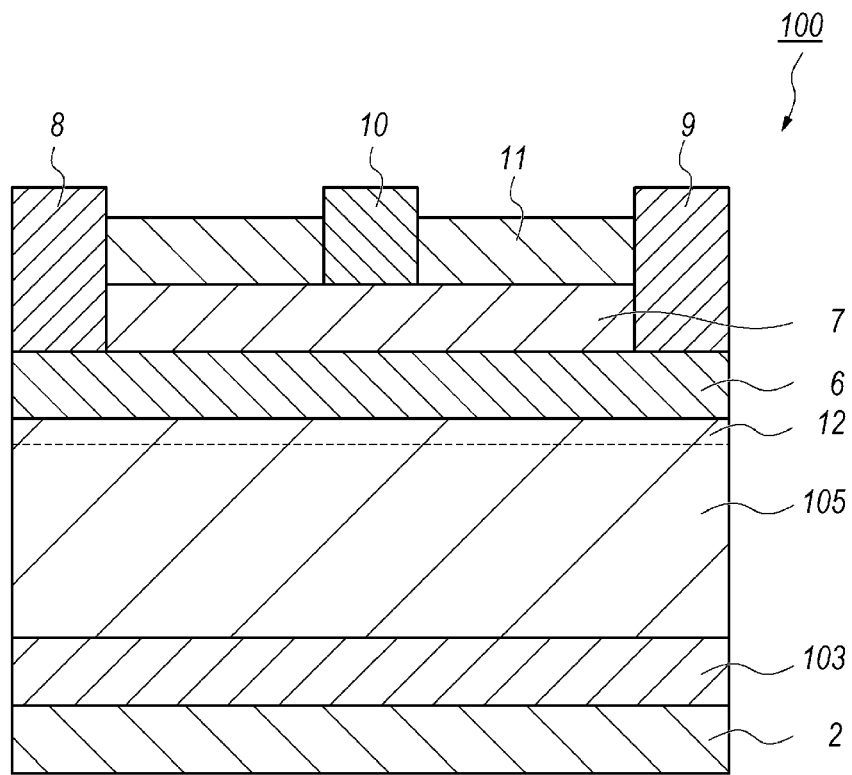
FIG. 5 schematically illustrates a cross section of a HEMT according to a conventional arrangement.

Next, the HEMT 1 of the present embodiment will be compared with a conventional HEMT 100 as referring to FIGS. 5 and 6; and advantages appearing in the embodiment will be described. FIG. 5 schematically illustrates a cross section of a HEMT according to a conventional arrangement, and FIG. 6 magnifies a portion from the substrate to a lower portion of the channel layer 105.

Figure 6:
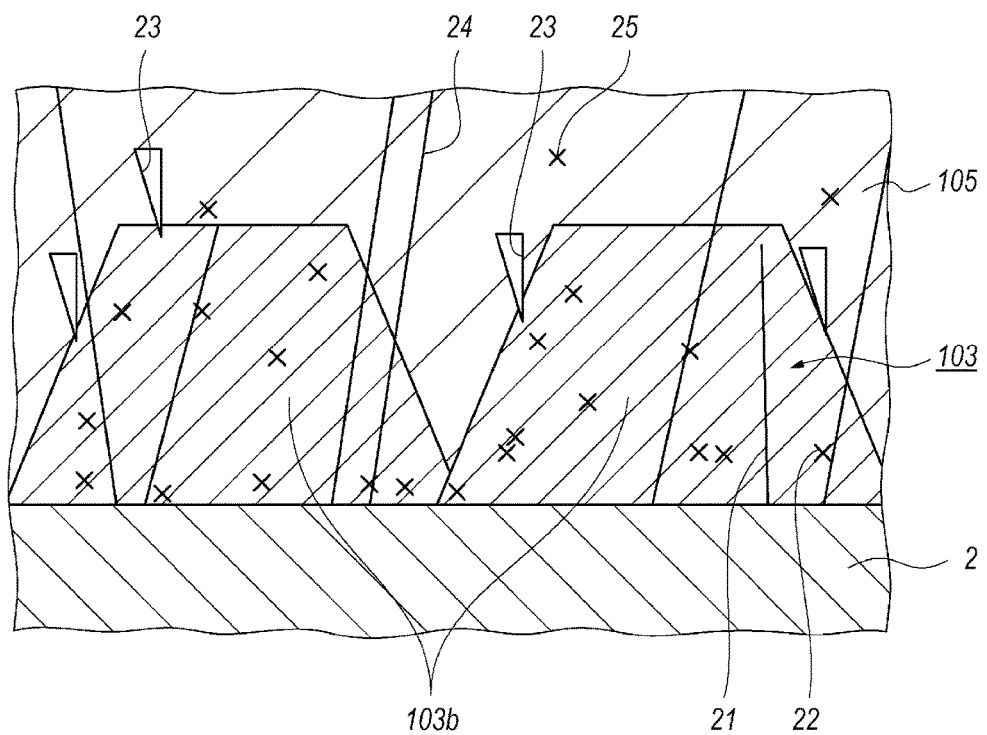
FIG. 6 magnifies a portion from the substrate to a lower portion of the channel layer in the HEMT shown in FIG. 5.
Figure 7:
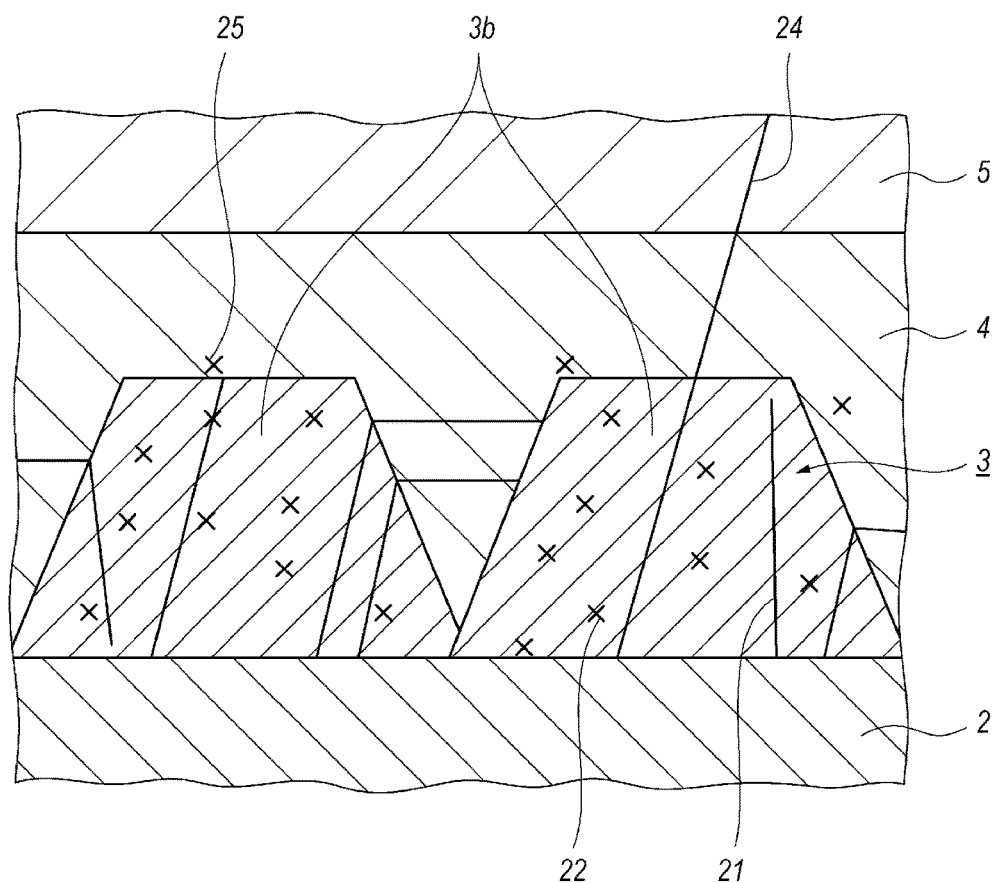
FIG. 7 magnifies a portion from the buffer layer to a lower portion of the channel layer in the HEMT shown in FIG. 2 according to the present invention.

The conventional HEMT 100 shown in FIG. 5 and FIG. 6 provides the GaN channel layer 105 just on the AlN buffer layer 103 without interposing the n-AlGaN layer 4 therebetween. The AlN layer 103 generally degrades crystal quality thereof when grown by the MOCVD at a temperature higher than 1100° C. The AlN layer grown at a temperature higher than 1100 easily causes many dislocations 21 and induces many impurities, where the former is denoted as lines while the latter is illustrated as ab x-character in the figures. Accordingly, the AlN layer 103 is grown by a thickness of about 50 nm at most in order to enhance the crystal quality of the GaN channel layer 105 to be grown thereon. In such a thickness, the AlN layer is hard to be grown in a layer but comprised of many islands 103b. The GaN channel layer 105 grown on such AlN layers 103 and having a lattice constant different from that of the AlN layer 103 inherently involves many voids 23 in regions close to the interface against the AlN layer 103. Also, the dislocations 21 caused in the AlN layer 103 easily transfer to the dislocations 24 in the GaN channel layer 105 and the impurities 22 are likely to move within the GaN channel layer 105. Accordingly, the GaN channel layer 105 directly grown on the AlN layer degrades the crystal quality thereof and induces many pits on the surface thereof. In order to reduce the pits, the GaN channel layer 105 must be grown thick enough.

Such dislocations and voids caused in the interface between the GaN channel layer 105 and the AlN barrier layer 103 may become traps for capturing and releasing a portion of carriers flowing in the channel 12, which degrades the transient response of the HEMT. Because the GaN channel layer inherently has bandgap energy relatively small among nitride semiconductor materials, the carriers in the channel 12 easily reach the traps originating from the dislocations 24, voids 23, and/or impurities 25 existing neighbor to the interface against the AlN layer 103.

On the other hand, the HEMT 1 of the embodiment interposes the n-AlGaN layer 4 between the GaN channel layer 5 and the AlN buffer layer 3. Moreover, the n-AlGaN layer has the lattice constant closer to that of the AlN layer 3 compared with that of the GaN channel layer and the bandgap energy greater than that of the GaN channel layer. Accordingly, the AlN buffer layer 3 in regions between the islands thereof may be effectively filled with the n-AlGaN layer. Accordingly, the dislocations 21 and the impurities 22 inherently involved within the AlGaN layer 3 are hard to be transferred within the GaN channel layer 5. Thus, the GaN channel layer 5 grown on the n-AlGaN layer 4 may enhance the crystal quality thereof. Moreover, because of the greater bandgap energy of the n-AlGaN layer 4 compared with that of the GaN channel layer 5, the carriers flowing in the channel 12 are hard to reach the interface between the n-AlGaN layer 4 and the AlN buffer layer 3 where the dislocations 24 and the impurities 25 possibly exist.

In addition, the GaN channel layer 5 of the embodiment is provided on the n-AlGaN layer 4 that shows a substantial conductivity because of the n-type dopants. Accordingly, even when traps appearing in the AlGaN barrier layer 6, in particular, the surface 6a thereof, or in the cap layer 7 capture the electrons, which equivalently charges the surface 6a in negative and expands the depletion region around the gate electrode 10, resultantly decreases the current flowing in the channel 12; the n-AlGaN layer 4 may partially compensate this decrease of the current in the channel. The phenomenon of the decrease of the drain current is widely known as the current collapsing. The HEMT 1 of the embodiment may effectively alleviate the current collapsing.

The conductivity of the n-AlGaN layer 4 may be easily controlled by the density of the n-type dopants. The HEMT 1 of the embodiment may have the n-AlGaN layer 4 with the donor density of 0.5 to $1.0 \times 10^{18}$ cm$^{-3}$. Excess donors, for instance greater than $1.0 \times 10^{18}$ cm$^{-3}$, may cause a large leak current of the HEMT 1, which converts the HEMT 1 into the normally-on configuration, or degrades the turning-off performance thereof. A HEMT with the n-AlGaN layer excessively doped with the n-type dopants never cuts the drain current even the gate thereof is set deep enough.

Figure 8:
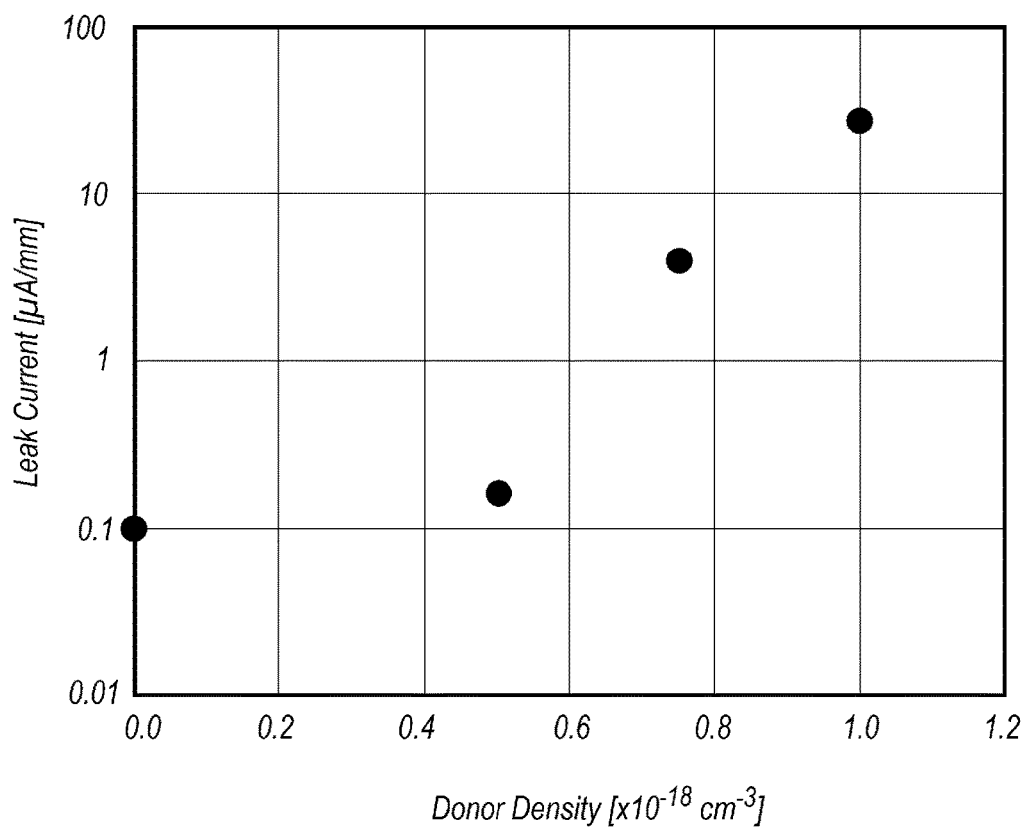
FIG. 8 shows a relation between the donor density in the n-AlGaN layer and the leak current measured in the HEMT according to the present invention.

Referring to FIG. 8, adequate donor density in the n-AlGaN layer 4 will be investigated. FIG. 8 shows a relation between the donor density in the n-AlGaN layer 4 and the leak current measured after the formation of the HEMT 1. As shown in FIG. 8, donor density greater than $0.5 \times 10^{18}$ cm$^{-3}$ causes a substantial leak current, specifically, the donor density of $1.0 \times 10^{18}$ cm$^{-3}$ brings the leak current of 40 μA/mm, and further increased donor density could result in a leak current by which the HEMT 1 never turns off. Thus, the adequate range of the donor density may be evaluated to be 0.5 to $1.2 \times 10^{18}$ cm$^{-3}$, preferably less than $1.0 \times 10^{18}$ cm$^{-3}$, by which the HEMT 1 may effectively suppress current collapsing without falling within the normally on mode.

Also, when the AlN layer 3 has the thickness of 13 to 20 mm, the n-AlGaN layer 4 and the GaN channel layer 5 preferably have thicknesses of 45 to 55 nm and 900 to 1100 nm, respectively. The n-AlGaN layer 4 provided between the AlN layer 3 and the GaN channel layer 5 may operate also as a seed layer for the GaN channel layer 5. The n-AlGaN layer 4 may fill the gaps between the islands 3b in the AlN layer 3 and flatten the surface 4a thereof because the voids 23 are hard to be induced in the n-AlGaN layer 4, which may further flatten the surface of the GaN channel layer 5.

Also, when the n-AlGaN layer has the thickness of 45 to 55 nm and the aluminum (Al) composition of 0 to 5%, the GaN channel layer 5 preferably has a thickness of 200 to 500 nm. Selecting the thickness and the aluminum composition of the n-AlGaN layer 4, the GaN channel layer may flatten the surface 5a thereof even when the thickness thereof is 200 to 500 nm.

Figure 9:
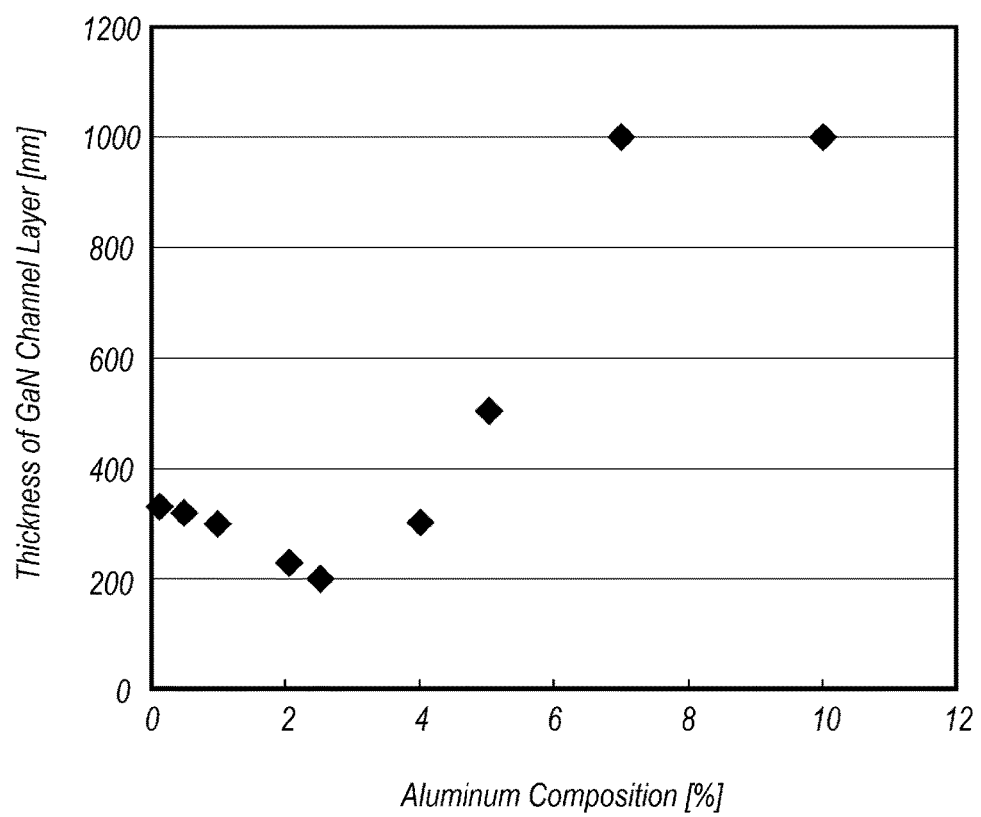
FIG. 9 investigates an adequate thickness of the n-AlGaN layer to flatten the surface thereof when the Al composition thereof is varied.

FIG. 9 investigates an adequate thickness of the n-AlGaN layer 4 to flatten the surface 5a thereof when the Al composition thereof is varied, where FIG. 9 in the horizontal axis thereof denotes the Al composition, while, the vertical axis corresponds to the thickness of the n-AlGaN layer 4 necessary to flatten the surface 5a thereof. In FIG. 9, the n-AlGaN layer 4 is assumed to have the thickness of 50 nm.

As FIG. 9 indicates, the thickness necessary to flatten the surface 5a of the GaN channel layer 5 reduces as the Al composition in the n-AlGaN layer 4 increases until 2.5% at which the GaN channel layer 5 may he thinned to around 200 nm. In an initial period of the growth of the n-AlGaN layer 4, aluminum atoms dominantly are adsorbed on the AlN layer 3 because of the difference of the lattice constant between aluminum and gallium, which causes an n-type AlGaN with an aluminum rich composition in a vicinity of the AlN layer 3 and promptly compensates the difference in the lattice constant. Thus, the GaN channel layer 3 with a smaller thickness may show a flattened surface 5a thereof. When the Al composition exceeds 2.5%, the thickness for the GaN channel layer necessary to flatten the surface 5a thereof increases. This is because excess aluminum atoms possibly fall within irregular positions because aluminum atoms generally show a shorter free running range after reaching onto a top surface of a grown layer. A source atom may set within a stable and/or regular position by a free running on the top surface of the grown layer after reaching thereto. Aluminum atoms set in the irregular positions may cause dislocations and defects, which may degrade the flatness of the surface of the GaN layer 3. Thus, the n-AlGaN layer 4 with the aluminum composition less than 5% may bring the GaN layer 5 a flattened surface even when the thickness thereof is less than 500 nm but greater than 200nm.

The process of the present embodiment may include a step of supplying only the dopant sources, which is silane $SiH_4$ in the embodiment, after the growth of the AlN buffer layer 3 but before the growth of the n-AlGaN layer 4.

Also, the process of the embodiment sets the temperatures for growing the AlN buffer layer 3, the n-AlGaN layer 4, the GaN channel 1a year 5, and the AlGaN barrier layer, respectively, substantially equal to each other. In such a condition, the semiconductor layers from the AlN buffer layer 3 to the AlGaN barrier layer may be grown continuously without extracting the substrate 2 from the apparatus.

Although the present invention has been fully described in conjunction with the preferred embodiment thereof with reference to the accompanying drawings, it is to be understood that various changes and modifications may be apparent to those skilled in the art. For instance, the temperatures for growing the AlN layer 3, the n-AlGaN layer 4, the GaN channel layer 5, and the AlGaN barrier layer 6, and the GaN cap layer 7 are different from each other, or at least one of those temperatures may be different from others.

Also, the n-AlGaN layer 4 may be a type of, what is called, a graded layer in the Al composition thereof. The Al composition in the n-AlGaN layer at the interface against the AlN layer 3 may be greater than the Al composition at the interface against the GaN channel layer 5. Such a graded layer of the n-AlGaN layer 4 may enhance the mechanism to flatten the surface 5a of the GaN channel layer, for instance, decreases the vacancies and the dislocations appearing in the n-AlGaN layer 4. The graded layer of the Al composition in the n-AlGaN layer 4 may be obtained by varying, or gradually decreasing the flow rate of the TMA during the growth thereof.

The present application claims the benefit of priority of Japanese Patent Application No. 2016-052438, filed on Mar. 16, 2016, which is incorporated herein by reference.

We claim:

1. A process of forming a high electron mobility transistor (HEMT), comprising steps of:
   sequentially growing an aluminum nitride (AlN) layer, an n-type aluminum gallium nitride (AlGaN) layer, a gallium nitride (GaN) channel layer, and an AlGaN barrier layer on a silicon carbide (SiC) substrate by a metal organic chemical vapor deposition (MOCVD) technique;
   further including a step of, after growing the AlN layer but before growing the n-type AlGan layer, supplying only dopant gas within an apparatus of the MOCVD technique;
   wherein the growth temperature of the SiC substrate and the growth pressure within the MOCVD apparatus are 1080° C. and 13.3 kPa, respectively, for growing the AlN layer, and wherein the step of supplying only the dopant gas is carried out at a temperature of 1080°C.

2. A process of forming a high electron mobility transistor (HEMT), comprising steps of:
   sequentially growing an aluminum nitride (AlN) layer, an n-type aluminum gallium nitride (AlGaN) layer, a gallium nitride (GaN) channel layer, and an AlGaN barrier layer on a silicon carbide (SiC) substrate by a metal organic chemical vapor deposition (MOCVD) technique;
   further including a step of, after growing the AlN layer but before growing the n-type AlGaN layer, supplying only dopant gas within an apparatus of the MOCVD technique;
   wherein the step of supplying only the dopant gas is carried out at a temperature of the SiC substrate and a pressure within the MOCVD apparatus that are the same as a temperature and a pressure for growing the AlN layer.

3. The process of claim 2,
   wherein the step of growing the n-type AlGaN layer includes a step of supplying tri-methyl-aluminum (TMA), tri-methyl-gallium (TMG), and ammonia ($NH_3$) as source gases for aluminum (Al), gallium (Ga), and nitrogen (N) respectively; and
   wherein the step of supplying only the only dopant gas and the step of growing the n-type AlGaN layer includes a step of supplying $SiH_4$ as the dopant gas.

4. The process of claim 2,
   wherein the growth temperature of the SiC substrate and the growth pressure within the MOCVD apparatus are 1080° C. and 13.3 kPa, respectively, for growing the AlN layer, and
   wherein the step of supplying only the dopant gas is carried out at a temperature of 1080° C.

5. The process of claim 2,
   wherein the step of sequentially growing the n-type AlGaN layer, the GaN channel layer, and the AlGaN barrier layer includes a step of keeping growth temperatures substantially the same as the temperature for growing the AlN layer and the temperature for growing the n-type AlGaN layer.

6. The process of claim 1,
   wherein the step of growing the n-type AlGaN layer includes a step of supplying tri-methyl-aluminum (TMA), tri-methyl-gallium (TMG), and ammonia ($NH_3$) as source gases for aluminum (Al), gallium (Ga), and nitrogen (N) respectively; and
   wherein the step of supplying only the only dopant gas and the step of growing the n-type AlGaN layer includes a step of supplying $SiH_4$ as the dopant gas.

7. The process of claim 1,
   wherein the step of sequentially growing the n-type AlGaN layer, the GaN channel layer, and the AlGaN barrier layer includes a step of keeping growth temperatures substantially the same as the temperature for growing the AlN layer and the temperature for growing the n-type AlGaN layer.

\* \* \* \* \*